United States Patent [19]
Kohjiro et al.

[11] Patent Number: 5,325,072
[45] Date of Patent: Jun. 28, 1994

[54] HIGH-FREQUENCY POWER AMPLIFIER DEVICE AND HIGH-FREQUENCY MODULE INCLUDING THE SAME

[75] Inventors: Iwamichi Kohjiro; Masahito Numanami, both of Komoro, Japan

[73] Assignee: Hitachi, Ltd., Tokyo, Japan

[21] Appl. No.: 988,892

[22] Filed: Dec. 10, 1992

[30] Foreign Application Priority Data

Dec. 18, 1991 [JP] Japan .................................. 3-334651

[51] Int. Cl.⁵ .......................... H03F 3/60; H01L 23/12
[52] U.S. Cl. ..................................... 330/286; 257/728; 330/307
[58] Field of Search ...................... 330/66, 67, 68, 286, 330/307, 65; 257/728

[56] References Cited

U.S. PATENT DOCUMENTS 3,784,883 1/1974 Duncan et al. ................. 257/728 X

FOREIGN PATENT DOCUMENTS 5591152 7/1980 Japan .

OTHER PUBLICATIONS

National Technical Report vol. 36, No. 4, Aug. 1990: "GaAs Power Amplifier Module for Portable Telephones", Y. Yamashita et al., pp. 34–38.
Gain, Sep., 1988, issued by Technical Center of Semiconductor Division of Hitachi, Ltd., pp. 23–25 (No. 70).

Primary Examiner—Steven Mottola
Attorney, Agent, or Firm—Antonelli, Terry, Stout & Kraus

[57] ABSTRACT

A high-frequency power amplifier device is provided in which the number of ground lines on the electronic parts mounting face of a strip line substrate having microstrip lines is reduced or eliminated. Specifically, a metallic cover extending in parallel with the mounting face of the strip line substrate is grounded, and the microstrip lines between this cover and the strip line substrate are electrically connected by connecting means such as capacitors and/or conductors.

13 Claims, 6 Drawing Sheets

HIGH-FREQUENCY POWER AMPLIFIER DEVICE AND HIGH-FREQUENCY MODULE INCLUDING THE SAME

BACKGROUND OF THE INVENTION

The present invention is effective is applied to an electronic device such as a high-frequency power amplifier device having microstrip lines. The high-frequency power amplifier device is assembled as one of electronic parts in a mobile radio communication unit such as a mobile telephone or cordless telephone using very high-frequency bands over UHF (Ultra High Frequency) or SHF (Super High Frequency) bands.

Generally speaking, the high-frequency power amplifier used in the transmitter of a radio communication unit is constructed of multiple stages including a predriver and a final driver driven by the predriver, so that it may amplify a low-level modulated high-frequency input signal into a necessary power level. Each of these predriver and final driver circuits is individually constructed of an independent semiconductor chip comprised of a GaAs FET (Gallium-Arsenic Field Effect Transistor) or a power MOSFET (Metal Oxide Semiconductor Field Effect Transistor). Each independent semiconductor chip is mounted on a wiring substrate (or strip line substrate), which is made of a ceramic substrate or the like formed in advance with predetermined wiring lines (or strip lines), to construct the high-frequency power amplifier device (which will be referred to as the "power amplifier module"). A power amplifier module having a plurality of GaAs FET chips mounted thereon is described, for example, on pp. 414 to 418 of National Technical Report Vol. 36, No. Aug. 4, 1990. On the other hand, a power amplifier module for a mobile telephone having three stages of power MOSFETs is described on pp. 23 to 25 of GAIN, September, 1988, issued by Technical Center of Semiconductor Division of Hitachi, Ltd.

In Japanese Patent Laid-Open No. 91152/1980, on the other hand, there is described a super high-frequency semiconductor integrated circuit device having a bypass capacitor and a semiconductor element in its package.

SUMMARY OF THE INVENTION

Figure 11:
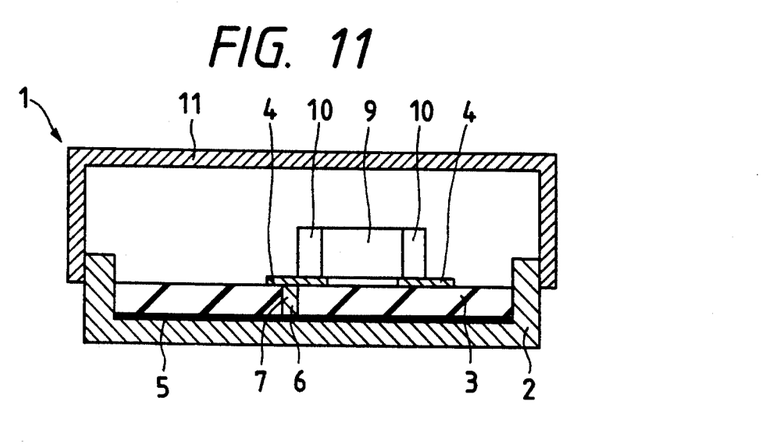
FIG. 11 is a section showing the structure of the GND supply of the high-frequency power amplifier device we have investigated.

We have revealed the following facts after we investigated more reductions of the sizes and costs and higher reliabilities of the power amplifier module of the aforementioned prior art and the high-frequency module having the former module. The high-frequency power amplifier device (i.e., the power amplifier module) we have investigated has a structure shown in FIG. 11, for example. FIG. 11 is a schematic diagram showing a structure having only one capacitor mounted thereon. A power amplifier module 1 has a structure, in which a strip line substrate 3 is fixed on a metallic radiating plate 2 acting as a casing substrate. The strip line substrate 3 is made of ceramics or the like and is equipped with a microstrip line 4 on its first principal face (or top face). On the other hand, the strip line substrate 3 is backed all over its second principal face (or back base), as indicated by a thick line, with a ground (GND) layer 5. This GND layer 5 is electrically connected with the radiating plate 2. The microstrip line 4 has its predetermined portion electrically connected with the GND layer 5 through a conductor 7 filling a through hole 6 formed in the strip line substrate 3. As a matter of fact, the microstrip line 4 is provided in plurality over the substrate 3 thereby to electrically (in a high frequency) connect electronic parts such as MOSFETs or chip resistors mounted on the first principal face of the substrate 3. For convenience of description, however, FIG. 11 shows the state, in which only one (chip) capacitor 9 is mounted on the substrate 3. The capacitor 9 has its two terminal electrodes 10 connected with the microstrip lines 4 through a bonding member made of solder or the like. On the other hand, the first principal face of the strip line substrate 3 is covered with a cover member 11. Although not shown, however, the strip line substrate 3 is equipped with leads having their portions led out of the casing which is formed of the radiating plate 2 and the cover member 11. Moreover, the microstrip lines 3 formed on the first principal face of the strip line substrate 3 are signal lines to be used mainly for signal transmission and are in the same layer as that of power supply lines, control lines, ground lines and so on, although not shown in FIG. 11. Moreover, the microstrip lines 4 have their impedances matched by connecting the predetermined lines and the GND lines in a high frequency through the capacitors and the resistors.

The power amplifier module described above has a problem that the area occupied by the GND lines on the strip line substrate is enlarged, because the strip line substrate is equipped on its numerous regions with the GND lines for supplying the GND potential. The occupied area is also enlarged because the circuit parts such as the capacitors are packaged in a horizontal direction with respect to the strip line substrate. The increase in the areas occupied by the GND lines or circuit elements (or parts) limits the size reduction of the strip line substrate, thus raising another problem that the power amplifier module is enlarged. On the other hand, the GND lines are usually connected with the common GND layer at the back of the strip line substrate through the through holes formed in the strip line substrate. In case, however, a number of through holes are formed to enhance the reliability (e.g., the ground potential supplying ability) of the ground (or earth), the probability of inconduction of the through hole portions may increase to deteriorate the electric reliability. It is also anticipated that the through hole forming process raises the production cost of the strip line substrate and accordingly the price of the power amplifier module. Since the GND lines are electrically connected with the common GND layer of the second principal face of the strip line substrate through the through holes, as described above, they have a low ground potential supplying ability. Thus, the structure has a difficulty in reducing the crosstalks between the signal lines.

Figure 12:
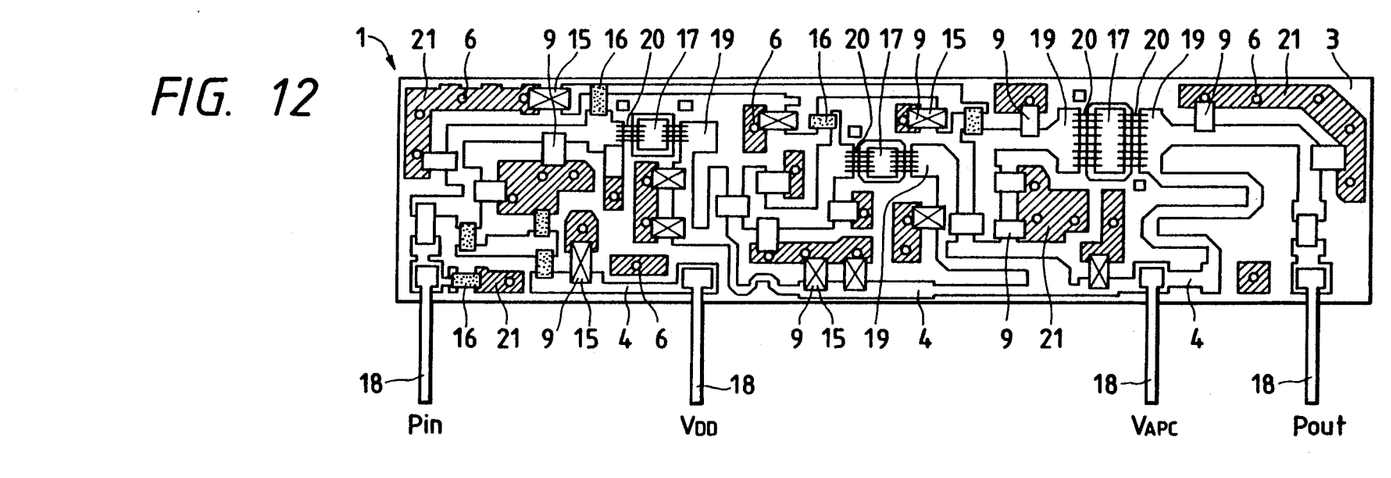
FIG. 12 is a top plan view of the strip line substrate and shows the microstrip line pattern and mounted parts we have investigated.

The aforementioned problem of the increase in the area of the strip line substrate occupied by the GND lines will be more specifically described with reference to FIG. 12. FIG. 12 shows: a layout of the micro strip lines 4 in the strip line substrate 3; passive parts to be mounted on the strip line substrate 3, such as capacitors 9, bypass capacitors 15 or resistors 16; active parts having MOSFETs mounted thereon, such as semiconductor chips 17; leads 18; and wires 20 for electrically connecting the electrodes of the semiconductor chips 17 and bonding pads 19 formed partially in predetermined ones of micro strip lines 4. The hatched portions over the substrate 3 indicate GND lines 21. As seen from the same Figure, the area of the strip line substrate 3 occupied by the GND lines 21 is remarkably wide. And, the circled portions in the GND lines 21 designate the through holes 6. These through holes are numerous because one or more of them are formed in each of the GND lines 21. Incidentally, the aforementioned capacitors 9, bypass capacitors 15 and resistors 16 are individual chip parts. In the same Figure, the bypass capacitors 15 are designated at symbols X by drawing diagonal lines. Moreover, the resistors 16 are designated by dotted blocks. On the other hand, the capacitors 9 extending between the predetermined microstrip lines 4 are simply designated by blocks. Moreover, the four leads 18 are divided into an input lead ($P_{in}$), a power supply lead ($V_{DD}$), a control lead ($V_{APC}$) and an output lead ($P_{out}$). Thus, it will be understood that the GND lines for supplying the ground potential to the aforementioned active and passive parts occupy a large area on the strip line substrate so that they exert restrictions upon the size reduction of the power amplifier module.

Figure 13:
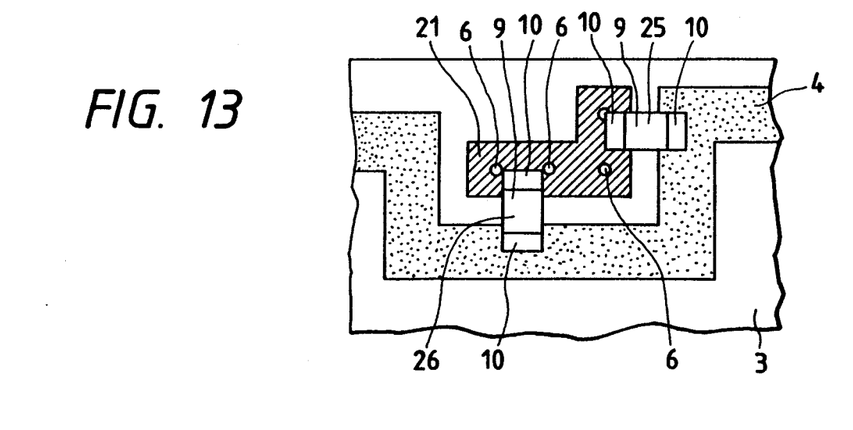
FIG. 13 is a top plan view of a portion of the strip line substrate and shows the arrangement relation between the capacitors and GND lines in the high-frequency power amplifier device we have investigated.

On the other hand, FIG. 13 shows, in an enlarged scale, the relations of arrangement between the capacitors and the GND lines on the strip line substrate 3 of the aforementioned power amplifier module of FIG. 12. FIG. 12 shows the layout state of the two capacitors 9, in which one electrode 10 of a first capacitor 25 and one electrode 10 of a second capacitor 26 are individually fixed in the microstrip line 4 (as indicated by the dotted area). Moreover, the other electrodes 10 of those two first and second capacitors 25 and 26 have to be electrically connected with the common GND disposed at the back of the strip line substrate 3 so that they are connected with the GND line 21 (as indicated by the hatched area), which is disposed on the first principal (or top) face of the strip line substrate 3 and electrically connected with the common GND through the through holes. The formation of the GND line 21 also requires an isolating space for isolating it from the strip line 4 electrically, as seen from FIG. 13, so that it requires a wide region. On the other hand, the micro strip line 4 or the signal line extends over the substrate 3 while bypassing the GND line 21, so that its pattern is complicated. It is therefore understood that the formation of the GND line 21 over the principal face of the strip line substrate 3 obstructs the size reduction of the strip line substrate 3 thereby to drop the degree of freedom for designing the microstrip line 4. The present invention has been conceived on the basis of the results of investigation thus far described.

An object of the present invention is to reduce the size of a strip line substrate by either reducing the number of GND lines (or patterns) or eliminating the same from the face of the strip line substrate for mounting electronic parts.

Another object of the present invention is to provide a high-frequency power amplifier device which is constructed to supply the GND from a cover member acting as a shielding member by fixing one of electrodes of a mounted part on a strip line substrate at the electronic parts mounting face of the strip line substrate and the other electrode directly on the cover member.

Still another object of the present invention is to drop the cost for the strip line substrate by either reducing the number of through holes or eliminating the same from the strip line substrate.

A further object of the present invention is to prevent oscillations by either reducing the number of through holes or eliminating the same from the strip line substrate.

A further object of the present invention is to prevent oscillations of a high-frequency module having the high-frequency power amplifier device packaged therein.

A further object of the present invention is to reduce the size and drop the cost of a high-frequency module having the high-frequency power amplifier device packaged therein.

The foregoing and other objects and novel features of the present invention will become apparent from the following description to be made with reference to the accompanying drawings.

A representative of the invention to be disclosed herein will be briefly described in the following. According to the present invention, there is provided a high-frequency power amplifier device comprising: a strip line substrate having microstrip lines on its first principal face; a cover member covering said first principal face and extending over said strip line substrate so that it is supplied with a ground potential; and connecting means disposed in a space, which is defined by the first principal face of said strip line substrate and said cover member, for connecting said microstrip lines and said cover member electrically.

The aforementioned connecting member is composed of electronic parts such as chip capacitors.

The aforementioned cover member is formed into a cover having a shielding effect by laminating an electrode material, a dielectric member and an electrode material. The GND and the capacitor are integrated, and the dielectric member is formed with holes. These holes are filled with dielectric materials and conductors having different dielectric constants to form capacitors and conducting layers of different capacities.

In a transmission module for mobile radio communications according to the present invention, on the other hand, there is packaged the aforementioned high-frequency power amplifier device in which the GND lines are not disposed on the electronic parts mounting face of the strip line substrate but the electronic parts or the conductor parts (or conductive layers) are electrically connected between the strip line substrate and the cover member. Moreover, the strip line substrate and the cover member thus superposed are equipped therearound with leads having clamps.

Since the high-frequency power amplifier device of the present invention is equipped with the connecting means for supplying the GND directly to the strip lines, it is possible to either reduce the number of or eliminate the GND lines which are mounted in the prior art on the electronic parts mounting face of the strip line substrate thereby to reduce the size of the strip line substrate.

Moreover, the size of the strip line substrate of the high-frequency power amplifier device can be reduced to highly integrate the high-frequency module containing the high-frequency power amplifier device.

In the high-frequency power amplifier device of the present invention, the GND is supplied from the side of the cover member. Thus, it is possible to either reduce the number of or eliminate the through holes from the strip line substrate thereby to reduce the oscillations such as the crosstalks and the cost for the strip line substrate.

The high-frequency power amplifier device of the present invention is constructed such that the electronic parts and conducting parts (or conductive layers) are electrically connected directly between the strip line substrate and the cover member. Thus, the GND connections to be made in the prior art by leading the through holes or the conductive layers can be eliminated to reduce the production cost.

In the high-frequency power amplifier device having its cover member made of the electrode material, the dielectric member and the electrode material, in addition to the foregoing effects, there can be attained effects that the number of parts for the assembly is reduced to facilitate the assembly and that the production cost can be reduced.

DESCRIPTION OF THE PREFERRED EMBODIMENTS

Figure 1:
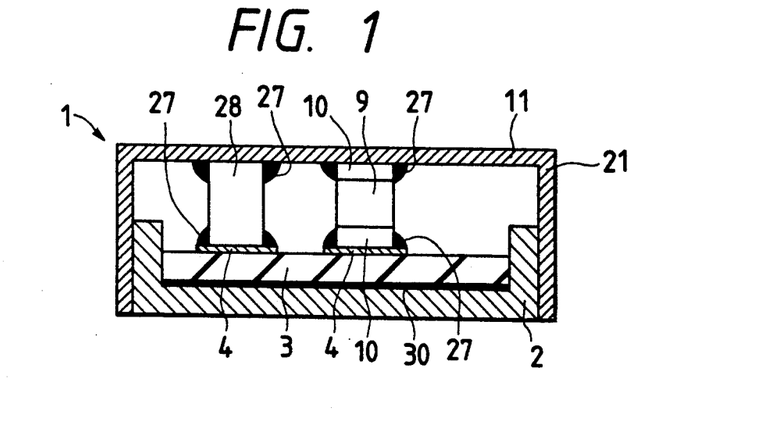
FIG. 1 is a transverse section showing a conceptional structure of a high-frequency power amplifier device according to the present invention.

The present invention will be described in the following in connection with its one embodiment with reference to the accompanying drawings. FIG. 1 shows a conceptional structure of a high-frequency power amplifier device according to the embodiment of the present invention.

Figure 2:
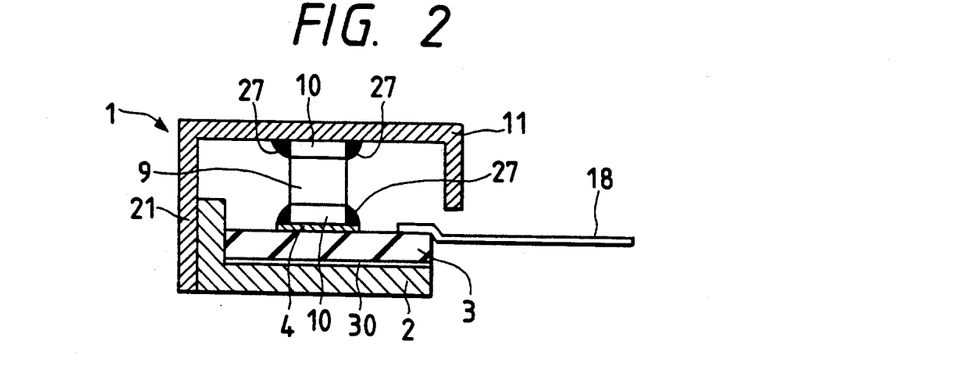
FIG. 2 is a longitudinal section showing the conceptional structure of the high-frequency power amplifier device of the present invention.

A high-frequency power amplifier device (or power amplifier module) 1 of the present invention is basically constructed, as shown in FIGS. 1 and 2, to either reduce the number of or eliminate the ground (GND) lines on the electric parts mounting face (or first principal face) of a strip line substrate 3. Moreover, a grounding cover member 11 is made of a metal such as Kovar or copper, and electronic parts such as a capacitor 9 are interposed between the copper member 11 and the first principal face of the strip line substrate 3. And, the capacitor 9 has its two terminal electrodes 10 fixed to a microstrip line 4 of the strip line substrate 3 and the cover member 11 by means of a bonding material 27 such as solder.

FIGS. 1 and 2 are schematic diagrams having only one capacitor 9 mounted. This capacitor 9 may be either a capacitor having a capacity of several pF or a bypass capacitor having a capacity of several tens thousands pF. The power amplifier module 1 is constructed, although not especially limitative, such that the strip line substrate 3 made of ceramics or the line is fixed on a metallic radiating plate 2 made of a thermally conductive metal such as copper for providing the container body. The strip line substrate 3 is equipped, on its first principal face for providing the electronic parts mounting face, with the microstrip lines 4. These microstrip lines 4 are formed to have a width of 0.6 mm, for example, by printing or sintering a paste of silver, copper, palladium or the like. The electronic parts such as the capacitor 9 to be mounted in the present invention are chip parts having the electrodes 10 at their two terminals. The capacitor 9 is given a thickness of about 1.0 to 2.0 mm, for example, and the electrodes 10 have a section given a size of 0.5 mm×0.5 mm or 0.8 mm to 1.6 mm. These parts sizes should be so considered that the capacitor 9 may not largely come out of the microstrip line 4 in case it is mounted upright on the strip line substrate 3. In this embodiment, moreover, metal columns 28 such as chip jumpers may be used to connect the microstrip lines 4 and the cover member 11. These metal columns 28 may be exemplified by conductors such as metal balls of solder. The metal columns 28 may constitute a stub. In this case, a normal stub can be obtained if the metal columns 28 have their upper sides contacting with the cover member, whereas an open stub can be obtained if a predetermined length is selected without contact with the cover member.

On the other hand, the strip line substrate 3 has its second principal face (or back face) covered in its entirety with a metallized layer 3, as indicated by a thick line. This metallized layer 30 is advantageous for improving the bonding state of the bonding material when the radiating plate 2 is to be connected for the assembly. Moreover, the strip line substrate 3 functions as a dielectric capacity element because it is sandwiched between the microstrip line 4 and the metallized layer 30. If here are considered the capacity (C) and the resistance component (R) of the microstrip line 4, a desired impedance can be achieved from the time constant of R and C. To the strip line substrate 3, on the other hand, there is attached a lead 18 which protrudes out of a container (or casing) defined by the radiating plate 2 and the cover member 11. Although not specifically divided, moreover, the microstrip line 4 arranged on the first principal face of the strip line substrate 3 constitutes a signal line, a power supply line, a control line and so on. In this embodiment, moreover, necessary characteristics (e.g., an impedance of 50 Ω) are attained by connecting a predetermined line in a high-frequency through an electronic part such as a capacitor or resistor or the conductor 28 with the directly grounding cover member 11.

Figure 3:
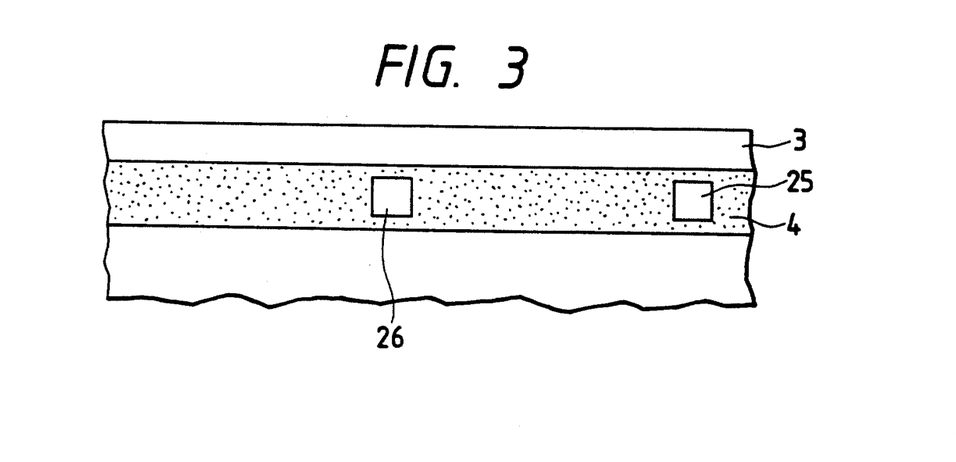
FIG. 3 is a top plan view showing a portion of a strip line substrate in an unnecessary state of a GND line in the high-frequency power amplifier device of the present invention.

In the power amplifier module 1 thus constructed, the area occupied by the GND lines is reduced to establish a vacant region by either reducing the number of or eliminating the GND lines on the first face of the strip line substrate 3, and this strip line substrate 3 can be small-sized either by mounting more electronic parts in that vacant region or packing the vacant region. FIG. 3 is shows an example corresponding to FIG. 13, in which the capacitor 9 is mounted without any change in the characteristics. In this case, GND lines 21 are so shortened that they need not be bypassed by the pattern of the microstrip lines 4. As a result, the area can be reduced to make the strip line substrate 3 small-sized thereby to improve the degree of freedom for designating the microstrip lines 4.

Figure 4:
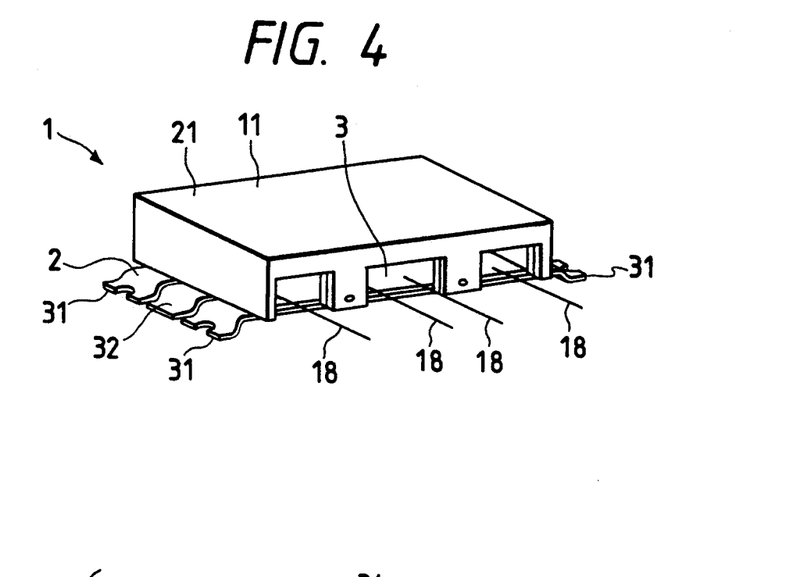
FIG. 4 is a perspective view showing the exterior of the high-frequency power amplifier device of the present invention.
Figure 5A:
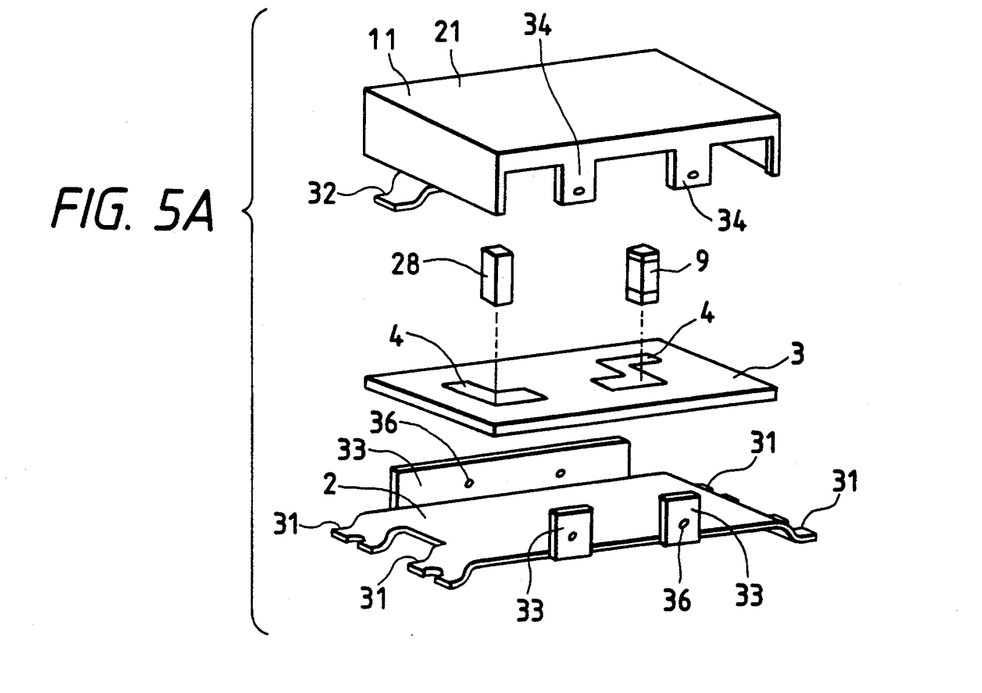
FIG. 5A is a conceptional, exploded perspective view partially showing the components of the high-frequency power amplifier device of the present invention.
Figure 6:
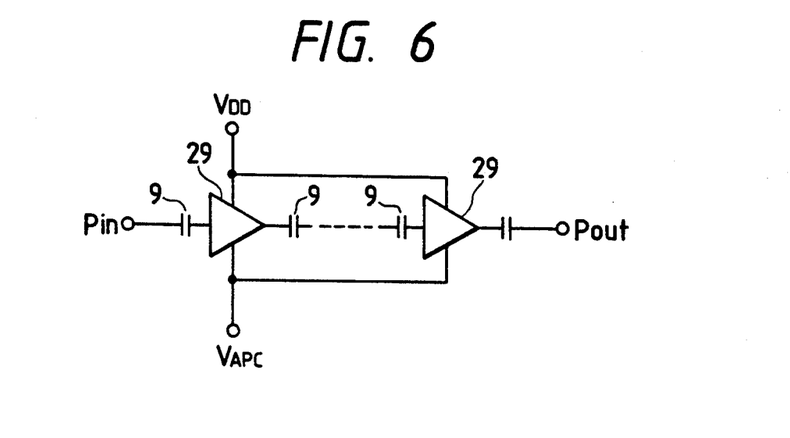
FIG. 6 is a conceptional circuit diagram showing the circuit construction of the high-frequency power amplifier device of the present invention.

FIG. 4 is a perspective view showing the exterior of the practical power amplifier module 1 of the present invention, and FIG. 5A is an exploded perspective view of the same. On the other hand, FIG. 6 is a conceptional circuit diagram showing the circuit construction of the same. In this power amplifier module 1, for example, there are packaged multiple or three stages of power MOSFETs 29 together with the capacitors 9 and so on. And, four external terminals (or leads) are incorporated. These four leads 18 are classified into an input lead ($P_{in}$), a power supply lead ($V_{DD}$), a control lead ($V_{APC}$) and an output lead ($P_{out}$).

FIG. 4 is made schematic by omitting the portion of the first principal face of the strip line substrate 3 and its mounted parts. In this example, fixing members 31 are protruded from the two ends of the radiating plate 2 so that the plate 2 may be fixed in a floating position to a mother board (e.g., a printed circuit substrate prepared by wiring copper lines on a glass-epoxy substrate). Those fixing members 31 are folded stepwise midway thereof so that the radiating plate 2 may float from the mother board. To the two ends of the cover member 11, there are also formed fixing members 32. These fixing members 32 are folded stepwise like the foregoing fixing members 31 so that they can contact with the mother board. Since the cover member 11 is connected with the conductive radiating plate 2, the casing has its ground electrically connected with the ground of the mother board through the fixing members 31. However, the cover member 11 is equipped with the fixing members 32 which in turn are fixed on the ground of the mother board, so that the ground strength is further enhanced. Incidentally, the radiating plate 2 and the cover member 11 are individually formed with fitting portions 33 and 34 so that they are fitted in each other. Moreover, the fitting portions 34 formed at the cover member 11 are formed with inward projections, whereas the fitting portions 33 formed at the radiating plate 2 are formed with small holes 36 for fitting the projections therein. Thus, the cover member 11 can be easily attached and detached.

Figure 5B:
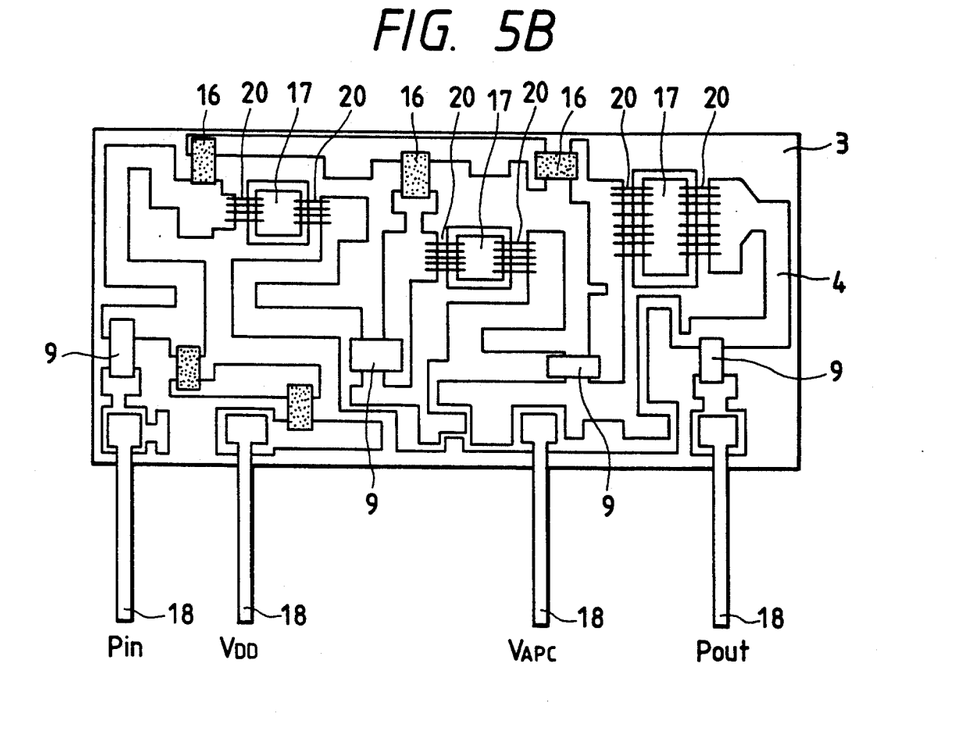
FIG. 5B is a top plan view specifically showing the layout of the electronic parts and strip lines over the strip line substrate 3 shown in FIG. 5A.

FIG. 5B shows a specific layout of the microstrip lines 4 formed on the strip line substrate 3 shown in FIG. 5A and the mounted parts (e.g., the MOSFETs 17, the chip capacitors 9, the chip resistors 16 and the leads 18). In the same Figure, the GND lines 21 shown in FIG. 12 can be omitted because the chip capacitors 9 are in direct contact with the cover member 11 positioned just above. Thanks to this omission of the GND lines 21, the through holes 6 need not be formed to invite advantages in the production cost. The chip capacitors 9 have a rectangular section in FIG. 5B but may have a square or circular section.

Figure 7:
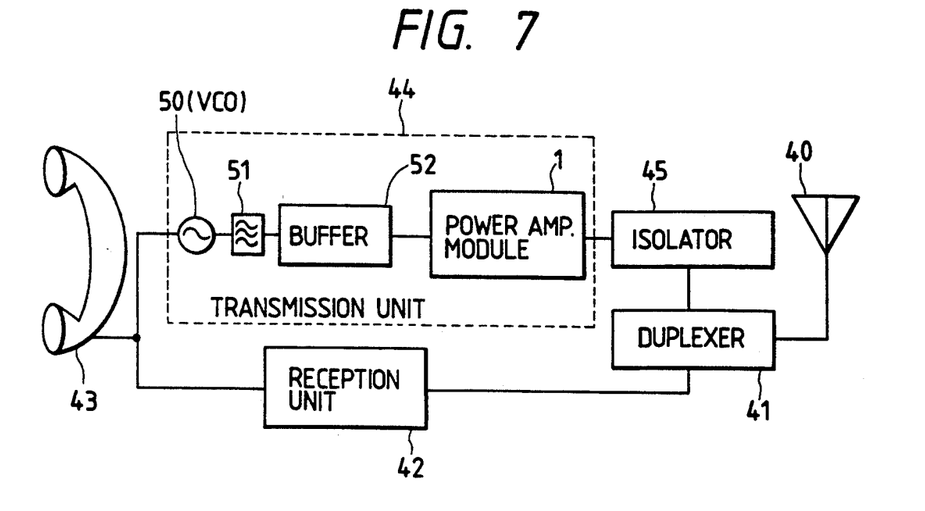
FIG. 7 is a block diagram showing a circuit construction of a mobile radio communication unit in which the high-frequency power amplifier device of the present invention is assembled.

The power amplifier module 1 thus constructed is assembled in a transmission module of a mobile car telephone having a medium or high output of 6 W to 20 W or a portable telephone having a low output of 1.2 W to 1.6 W, for example. This telephone has a construction, as shown in FIG. 7. Specifically, electric waves received by an antenna 40 are send through a duplexer 41 to a reception unit 42 and further as aural signals to a telephone set 43. On the other hand, aural signals coming into the telephone set 43 are sent to a transmission unit 44 and are transmitted from the antenna 40 through an isolator 45 and the duplexer 41. The transmission unit 44 is composed of an oscillator (VCO) 50, a filter 51, a buffer (or buffer amplifier) 52, the power amplifier module 1 and so on.

Figure 8:
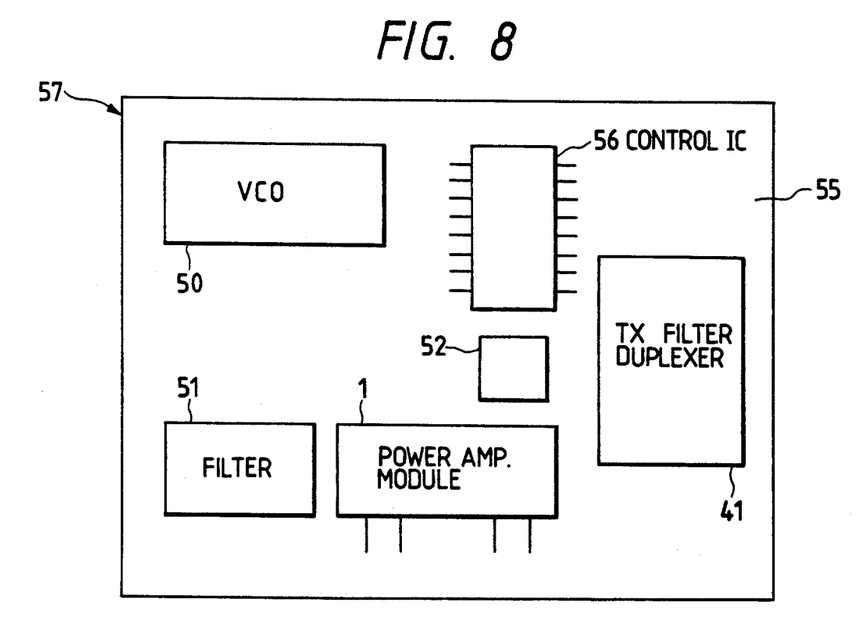
FIG. 8 is a block diagram showing a high-frequency module in the mobile radio communication unit according to the present invention.

FIG. 8 is a block diagram showing a high-frequency module 57 in a mobile radio communication unit in which is mounted the power amplifier module 1 of the present invention. On the principal face of a mother board 55, there are mounted the oscillator (VCO) 50, the filter 51, the power amplifier module 1, the buffer 52, a control IC 56, the duplexer 41 and so on, all of which constitute a predetermined circuit. The transmission module 57 is reluctant in its entire module to oscillator and accordingly free from troubles such as crosstalks because the through holes of the strip line substrate 3 of the power amplifier module 1. Since, moreover, the power amplifier module 1 is small-sized, the effective space for the mother board 55 in the transmission module 57 for the mobile radio communications is increased to multiply the functions or reduce the size of the transmission module 57.

Thus, in the high-frequency power amplifier device of the present invention, since no ground line is formed on the electronic parts mounting face of the strip line substrate, more electronic parts can be mounted in the vacant region to achieve an effect of high integration.

Since, moreover, the high-frequency power amplifier device of the present invention is equipped with no ground line on the electronic parts mounting face of the strip line substrate, it can achieve another effect that the strip line substrate can be accordingly small-sized.

Since, still moreover, the high-frequency power amplifier device of the present invention is enabled to prevent oscillations by eliminating the through holes from the strip line substrate, it can achieve still another effect that the potentials for troubles such as crosstalks can be dropped.

Since, still moreover, the high-frequency power amplifier device of the present invention is enabled to prevent oscillations by eliminating the through holes from the strip line substrate, it can achieve a further effect that the cost to be consumed for forming the through holes can be reduced to drop the production cost of the strip line substrate.

Since, still moreover, the high-frequency power amplifier device of the present invention is constructed to connect the electronic parts and the conductor parts (or conducting layer) directly between the strip line substrate and the cover member, it is freed from wiring the conducting layer on the sides or the like thereby to have a further effect that the production for the strip line substrate can be dropped.

On the other hand, the transmission module for the mobile radio communications of the present invention having the high-frequency power amplifier device of the present invention assembled therein has an effect in improving the characteristics because the high-frequency power amplifier device will not oscillate.

Moreover, the transmission module for the mobile radio communications of the present invention having the high-frequency power amplifier device of the present invention assembled therein has its high-frequency power amplifier device made small-sized and can mount other parts in the vacant region so that it can have an effect to improve the functions of the transmission module for the mobile radio communications.

Still moreover, the transmission module for the mobile radio communications of the present invention having the high-frequency power amplifier device of the present invention assembled therein has its high-frequency power amplifier device made small-sized so that it can have an effect to reduce its size accordingly.

Thus, according to the present invention, there can be achieved a multiplied effect that it is possible to provide both a small-sized and inexpensive high-frequency power amplifier device and a mobile radio communication transmission module having excellent characteristics.

Figure 9:
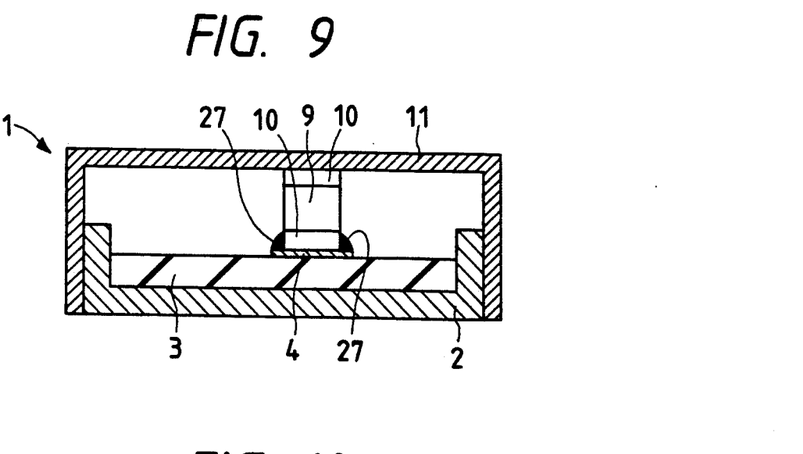
FIG. 9 is a section showing a conceptional structure of a high-frequency power amplifier device according to a modification of the present invention.

Although our invention has been specifically described in connection with the embodiment thereof, it should not be limited to the embodiment but can naturally be modified in various manners without departing from the gist thereof. For example, FIG. 9 shows a structure in which no metallized layer 30 is formed on the second principal face of the strip line substrate 3 facing the radiating plate 2. In this power amplifier module 1, too, the cover member 11 is made of a conductive material so that it constitutes the ground of the casing to provide predetermined characteristics. On the other hand, the radiating properties can be improved if a heat generating semiconductor chip is mounted on the cover member 11.

Figure 10:
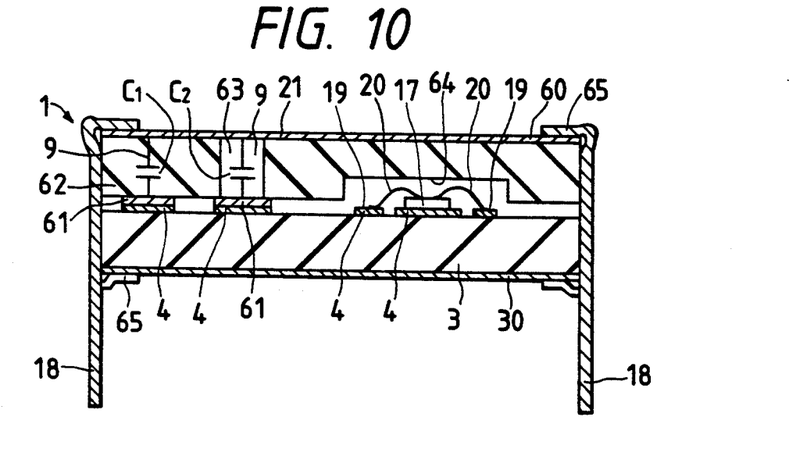
FIG. 10 is a section showing a conceptional structure of the high-frequency power amplifier device according to the modification of the present invention.

FIG. 10 is a section showing a conceptional structure of the high-frequency power amplifier device according to another embodiment of the present invention. This embodiment is constructed by equipping the cover member 11 with the capacitor. Specifically, this cover member 11 is prepared by multi-layering and sintering an electrode material, a dielectric member and an electrode material into a plate shape. As a result, two electrodes 60 and 61 and an intervening dielectric member 62 form altogether the (inter-layer) capacitor 9. This capacitor 9 has its capacity varied with the dielectric constant of the dielectric member 62. In this embodiment, therefore, the dielectric member 62 is formed in its predetermined portions with holes 63, which are filled up with dielectric materials of different dielectric constants to form the capacitors 9 of different capacities. For example, the dielectric members 62 are made of $Al_2O_3$ to form the capacitors 9. On the other hand, the electrodes 60 and 61 at the two faces of the cover member 11 may be connected by filling those holes with a metal having a small resistance. Since, moreover, the power amplifier module 1 is constructed by bonding the two plate-shaped members, i.e., the strip line substrate 3 and the cover member 11 to each other, a recess 65 is formed not to deteriorate the mounted semiconductor chip 17 or the like. Around the strip line substrate 3 and the cover member 11 thus bonded, still moreover, there are attached the leads 18 which are equipped with clip portions 65 used generally in a mixed integrated circuit device.

Furthermore, the high-frequency power amplifier device having its cover member formed of the electrode material, the dielectric member and the electrode material has a reduced number of parts and has, in addition to the foregoing effects, an effect that the assembly can be facilitated to reduce the production cost.

In the description thus far made, our invention has been described in case it is applied to the manufacture technology of the transmission module for the mobile radio communications backgrounding the invention. Despite of this description, however, the invention should not be limited thereto but can also be applied to a mixed integrated circuit device. After all, the present invention can be applied to an electronic device having at least the strip line substrate.

What is claimed is:

1. A high-frequency power amplifier device comprising:
   a strip line substrate having a plurality of microstrip lines on a first surface of said strip line substrate;
   a cover member covering said first surface and extending over said strip line substrate, said cover member being supplied with a ground potential; and
   connecting means for electrically connecting at least one of said microstrip lines and said cover member, said connecting means being disposed in a space which is defined by the first surface of said strip line substrate and said cover member,
   wherein said connecting means is arranged just above said one of said microstrip lines and is connected with an inner wall of said cover member just above said one of said microstrip lines.

2. A device according to claim 1, wherein said connecting means is a chip capacitor having its two terminal electrodes individually connected with said microstrip lines and said cover member electrically.

3. A device according to claim 1, wherein said connecting means is made of a conductor.

4. A device according to claim 1, wherein said strip line substrate is formed with no through hole.

5. A device according to claim 1, wherein said cover member includes a dielectric member and two metal electrodes sandwiching said dielectric member.

6. A device according to claim 5, wherein said dielectric member has partially different film thicknesses.

7. A high-frequency module comprising:
   (1) a printed wiring substrate;
   (2) a plurality of functional circuit modules mounted on said printed wiring substrate; and
   (3) a power amplifier module mounted on said printed wiring substrate between said plurality of functional circuit modules,
   wherein said power amplifier module includes: a strip line substrate having microstrip lines on its first principal face; a cover member covering said first principal face and extending over said strip line substrate so that it is supplied with a ground potential; and connecting means disposed in a space, which is defined by the first principal face of said strip line substrate and said cover member, for connecting said microstrip lines and said cover member electrically, and
   wherein said power amplifier module and said plurality of functional circuit modules are connected with each other through wiring lines formed on said printed wiring substrate.

8. A high-frequency module comprising:

(1) a printed wiring substrate;
(2) a plurality of functional circuit modules mounted on said printed wiring substrate; and
(3) a power amplifier module including,
a strip line substrate having microstrip lines on a first surface of said strip line substrate;
a cover member covering said first surface and extending over said strip line substrate, said cover member being supplied with a ground potential; and
connecting means disposed in a space, which is defined by said first surface of said strip line substrate and said cover member, for connecting at least one of said microstrip lines and said cover member electrically, wherein said power amplifier module is mounted on said printed wiring substrate between said plurality of functional circuit modules, wherein said connecting means is arranged just above said one of said microstrip lines and is connected with an inner wall of said cover member just above said one of said microstrip lines, and wherein said power amplifier module and said plurality of functional circuit modules are connected with each other through wiring lines formed on said printed wiring substrate.

9. A high-frequency power amplifier device according to claim 1, wherein said strip line substrate has a second surface opposite to said first surface, and wherein said second surface of said strip line substrate is covered with a metallized layer which is supplied with said ground potential.

10. A high-frequency power amplifier device according to claim 9, further including a radiating metal plate on said metallized layer, wherein said radiating metal plate and said cover member contact each other at a periphery of said strip line substrate to form a box-shaped structure.

11. A high-frequency power amplifier device comprising:
a strip line substrate having a plurality of microstrip lines on a first surface of said strip line substrate;
a cover member covering said surface and extending over said strip line substrate, said cover member being supplied with a ground potential; and
connecting means for electrically connecting at least one of said microstrip lines and said cover member, said connecting means being disposed in a space which is defined by the first surface of said strip line substrate and said cover member,
wherein said connecting means is a chip capacitor having its two terminal electrodes individually connected with said microstrip lines and said cover member electrically.

12. A high-frequency power amplifier device comprising:
a strip line substrate having a plurality of microstrip lines on a first surface of said strip line substrate;
a cover member covering said first surface and extending over said strip line substrate, said cover member being supplied with a ground potential; and
connecting means for electrically connecting at least one of said microstrip lines and said cover member, said connecting means being disposed in a space which is defined by the first surface of said strip line substrate and said cover member,
wherein said cover member includes a dielectric member and two metal electrodes sandwiching said dielectric member.

13. A device according to claim 12, wherein said dielectric member has partially different film thicknesses.

* * * * *